United States Patent Office 3,069,599

Patented Dec. 18, 1962

3,069,599

PLUG-IN CONTACT DEVICE FOR PLATES CARRYING CIRCUIT COMPONENTS

Freiwalt Schön, Gauting, near Munich, Germany, assignor to Siemens & Halske Aktiengesellschaft, Berlin and Munich, a German corporation Filed Sept. 28, 1960, Ser. No. 59,946
Claims priority, application Germany Oct. 2, 1959
6 Claims. (Cl. 317—101)

This invention relates to a contact arrangement provided upon a plate carrying groups of electrical circuit components, and is particularly concerned with a plug-in contact device provided upon such a plate, comprising individual plug contacts made of wires anchored to the plate at two points between which extends the contacting zone, the anchoring of the wires being effected by means employed in connection with the manufacture of printed circuits.

Plates carrying groups of electrical circuit components, in the manner of printed circuits, are being increasingly used especially in the communication arts. These plates are removably connected with circuited apparatus by means of plug-in devices customarily comprising contact elements at one plate margin, such elements forming the plug portion of the respective connecting device. The advantage of such plates resides in simplicity of manufacture which is particularly suitable for mass production and also in the relative ease of removal thereof in the event that removal should be desired to remedy troubles resulting from the failure of one or the other circuit component carried thereby.

The plug contact portions of such plates pose particular problems.

In case of printed circuits, the contact elements of the plug portions are usually produced by etching, in the same manner as the wiring portions for the circuit components. The difficulties which appear thereby reside in providing the plug contacts with a surface of noble metal. Moreover, only relatively thin plug contacts are obtained in the etching process, which cannot withstand the mechanical stresses resulting from repeated removal and replacement of the corresponding plates, entailing pressures with which the socket springs must engage the plug contacts, thus necessarily resulting in a rubbing action which may easily destroy thin layers or coatings forming the plug contacts.

It has therefore been attempted to provide upon the plates, in place of the etched plug contacts, special contact members consisting of metallic strips with the ends thereof clamped to the plate. These metallic strips must subsequently be electrically interconnected with the wiring of the circuit components which are respectively associated therewith. This kind of plug contacts necessitates manufacture of special parts and, due to the clamping thereof to the plate, a corresponding working of the latter.

The present invention proposes, as compared with the above indicated prior arrangement, a considerably simplified contact arrangement forming the plug part in connection with plates carrying electrical circuit components. The contact arrangement according to the invention provides inidvidual plug contacts consisting of wires which are anchored to the plate at two points between which extends the contacting zone.

The use of wire for the plug contacts provides in the first place the considerable advantage of having available a material which can be mass produced in desired thickness and quality, thus eliminating all special punching tools as well as physical or chemical manufacturing processes required in connection with the heretofore customarily employed metallic strips and the etched plug contacts respectively. The use of wire according to the invention permits moreover provision of wider spacing between the individual plug contacts since the wires require considerably less space per area of the plate than metallic strips or plug contacts formed by etching. This in turn permits placing the wire plug contacts closer together, thus resulting in a more compact placement thereof. Attention may also be called to the fact that wires can be simply and economically coated with noble contact material, which entails some difficulties particularly in connection with printed circuits and also in connection with the previously employed metallic strip members.

The wire plug contacts are suitably anchored in place by a procedure employed in the production of printed circuits. An example of such procedure has been disclosed in the copending application Serial No. 19,662, filed April 4, 1960, which is particularly suited for the present purpose. In such procedure, the wire is guided over the plate and at predetermined anchoring points, by means of a plungerlike punch and a clamping member is pressed into holes under tension, thus effecting anchoring thereof in the plate. Circular disks are thereby suitably used as clamping or anchoring elements, such disks being provided with oppositely radially inwardly extending recesses, for receiving the wire, and fitting tightly in the respective anchoring holes.

The various objects and features of the invention will appear in the course of the description which is rendered below with reference to the accompanying drawings, wherein.

Figure 1:
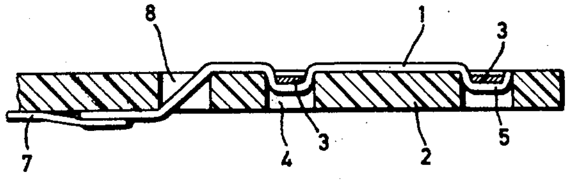
FIG. 1 shows in part cross sectional view an example of a plug contact arrangement according to the invention, as applied on one side of a plate which carries circuit wiring on the other side thereof.
Figure 2:
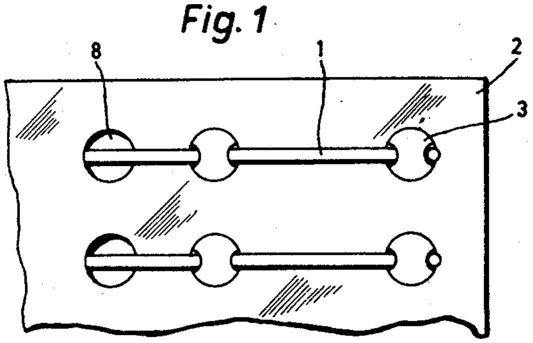
FIG. 2 is an elevational view of part of the plate equipped as shown in FIG. 1.
Figures 3, 6, 7:
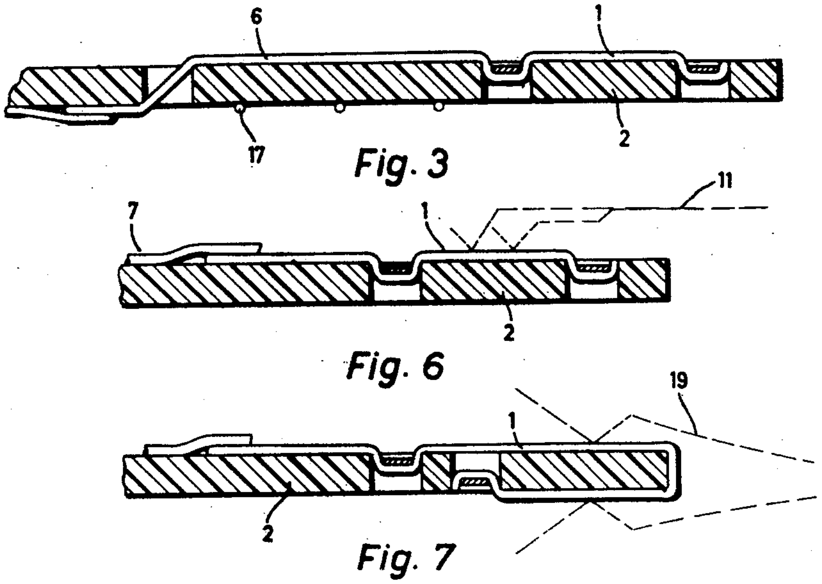
FIG. 3 represents a modification of the structure indicated in FIG. 1.
Figure 4:
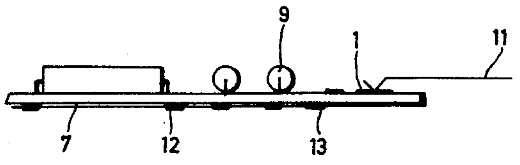
Figure 5:
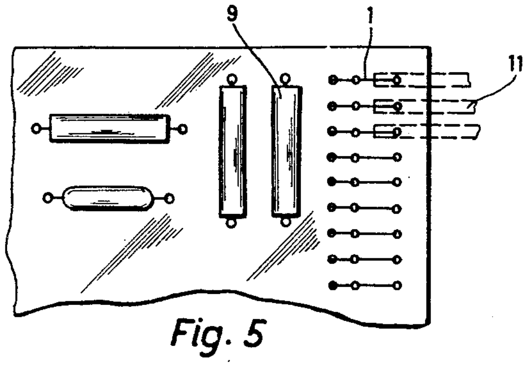
Figure 8:
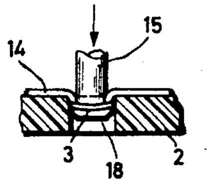
Figure 9:
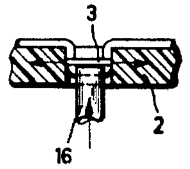

FIG. 4 indicates a plate carrying on one side thereof a group of circuit components and plug contacts and having wiring disposed on the other side thereof;

FIG. 5 is an elevational view of the arrangement according to FIG. 4;

FIG. 6 shows in part sectional view plate having the plug contact arrangement according to the invention on the same side on which is arranged the circuit wiring;

FIG. 7 represents in part sectional view a plate provided with U-shaped plug contacts according to the invention, such contacts being wrapped about one edge of the plate; and FIGS. 8 and 9 illustrate steps involved in automatically anchoring the plug contact wires on a plate.

The embodiment of the invention illustrated in FIGS. 1 to 5 constitutes a plug contact arrangement consisting of wires disposed upon the side of a plate opposite the side thereof which carries the circuit wiring. Each of the several portions 1 is anchored to the plate 2 at two points by means of the previously described wiring procedure also illustrated in FIGS. 8 and 9. The wire is thereby drawn into the holes 4 and 5 and fastened therein by means of clamping or anchoring members 3. The wire portion 1 extending between the two anchoring points forms the contacting zone or portion for cooperation with a socket contact in a manner to be presently explained more in detail. The wire which extends from the portion 1 is drawn through a further hole 8 to the other side of the plate 2 where the end thereof is soldered to the conductor 7 forming part of the circuit wiring of the respectively associated circuit components.

The manner of placing the portions 6 of the plug contact wire on the plate 2 and extending it through the hole 8 permits, as shown in FIG. 3, disposal thereof in crossing relation with respect to wires 7 arranged on the other side of the plate and belonging to the circuit wiring. Such crossing would entail some difficulties if the plug contact wire were placed on the same side of the plate as the circuit wiring because care would have to be taken to provide proper insulation between the parts. In the illustrated case, the insulation is automatically provided by the plate 2 extending between the wire portion 6 and the circuit wires 7.

FIGS. 4 and 5 show the manner of using the above described structure in connection with a plate carrying on one side thereof a group of circuit components such as 9 and also the plug contact wires 1. The electrical connecting points 12 of the circuit components and the wiring 9, with 7, as well as connecting points 13 of the respective plug wires 1, with the circuit wires 7, are disposed on the other side of the plate. Accordingly, all electrical connecting points are disposed upon the side of the plate which is free of circuit components as well as of the contacting zones of the plug wires 1. This arrangement permits the use of an automatic soldering procedure in which the contact points which are to be electrically interconnected are soldered in common, for example, by immersion into solder.

Numeral 11 in FIGS. 4 and 5 indicates the socket contacts which are in resilient engagement with the plug contact wires 1. The latter allow for some lateral shifting of the socket contacts 11 with respect to the plate, without sliding off from the plug contacts 1 and without danger of contacting neighboring plug contacts. The structure thus eliminates the drawback which is inherent in prior arrangements using striplike plug contacts, wherein even slight lateral shifting of the parts may result in overlapping of the plug contacts with the socket contacts, thereby resulting in wrong contacting.

The structure of the plug contacts according to the invention assures reliable contacting since the cylindrical plug contact wires provide in all circumstances defined contact points for cooperation with the socket contacts.

The socket contacts 11 indicated in FIGS. 4 and 5 are suitably arranged on a socket strip or bar (not shown). Such bar is in known manner provided with an element (likewise omitted from the drawing) for moving the socket contacts 11 into contact pressure engagement with the respective plug wires 1 after the latter are in plugged-in position with respect thereto.

In the arrangement shown in FIG. 6, the plug wires 1 are disposed on the side of the plate 2 which also carries the wiring 7 for the circuit components. The extension of the plug contact wires through the plate to the other side thereof, as described in connection with FIGS. 1 to 5, is in such case avoided. The connecting points (such as 12 in FIG. 4) of the wiring for the circuit components as well as the wiring 7 and the contact points (such as 13 in FIG. 4) are thus on the side of the plate 2 which also carries the plug contact wires 1, and the circuit components are accordingly disposed upon the other side of the plate 2.

FIG. 7 shows an arrangement in which the plug-in edge of the plate 2 is provided with plug contacts 1 adapted to spread socket contacts such as 19 apart when the plate is placed in plugged-in position. The plug contact wires such as 1 are in such case U-shaped and embrace the corresponding edge of the plate 2. The plug contact wires 1 are anchored to the plate 2 at two mutually displaced points as shown. This displacement is necessary since the anchoring is effected in accordance with the procedure described in the previously noted copending application Serial No. 19,662, wherein the anchoring points are defined by holes formed in the plate. The wrapping of the plug contact wire 1 about the edge of the plate 2 provides a blunt plug contact wedge which can be easily inserted between socket contacts such as 19 carried by a socket contact strip, the socket contact springs 19 thereby spreading apart and establishing secure engagement with the respective plug contact wedges.

It is also possible to use the same wires for the circuit wiring and also for forming the plug contact elements. This will result in the advantage of producing in an automatic procedure the plug contact elements coincident with producing the circuit wiring and thus eliminating the subsequent soldering of the plug contacts to the wiring of the circuit components . In case a particularly low transition resistance is required in the contacting by the plug contact elements, calling for the provision of a coating, for example, of silver or gold, on such elements, a correspondingly coated wire may be used throughout, including the portions which are to form the circuit wiring, which is readily possible especially in structures involving relatively short circuit wiring. The material for the circuit wiring and for the plug contacts is thus of uniform quality. However, if it is for reasons of saving costs desired to use normal wires for the circuit wiring, the two types of wires are suitably interconnected as indicated in FIGS. 1, 2, 3, 6 and 7.

FIGS. 8 and 9 show how the plug contact wires are anchored in the plate 2 by the use of the procedure described in the previously noted copending application Serial No. 19,662. The plate 2 is provided with anchoring holes formed therein, one such hole being indicated by numeral 18. The corresponding wire 14 is guided to extend across the hole and is drawn thereinto by a disk 3 which is downwardly moved against the wire, by a punch 15. The disk 3 is provided with two oppositely disposed radially inwardly extending recesses formed therein (see also FIGS. 1 and 2), for accommodating the wire, and fits tightly in the hole, thus holding the wire with pressfit anchored in the hole after the punch 15 is withdrawn. The disk 3 is incident to the wire anchoring operation slightly downwardly arched, as indicated in FIG. 8. A counter punch 16 is therefore used for exerting pressure against the arched disk 3, as shown in FIG. 9, thereby restoring the plane shape of the disk and imparting thereto forces acting radially outwardly against the inner wall of the anchoring hole, as indicated by the double arrow, thereby clamping the disk firmly in place and thus securely anchoring the wire in its position.

It is understood, of course, that the plug contact wire may be anchored in the plate by different means. The described method is however particularly suitable because it can also be advantageously employed for effecting the wiring of the circuit components carried on the place.

Changes may be made within the scope and spirit of the appended claims which define what is believed to be new and desired to have protected by Letters Patent.

I claim:

1. In combination with a plate equipped with electrical components which are respectively connected by means of circuit wires looped into and anchored within holes formed in said plate, contacts respectively interconnected with circuit wires of predetermined components, said contacts being arranged near an edge of said plate for plug-in cooperation with socket contacts for the purpose of extending the circuits of the corresponding components, each of said plug-in contacts being made in the form of a wire looped into and anchored by means of a clamping element within each of two further spaced apart holes formed in said plate, the portion of each such wire extending from one to the other of the two further anchoring holes forming in plugged-in position the contacting portion for engagement with a cooperating socket contact.

2. The combination according to claim 1, wherein the wires forming said plug-in contacts are of the type employed for the circuit wires for connecting said electrical components.

3. The combination according to claim 1, wherein the wires forming said plug-in contacts are disposed upon the side of said plate which carries the circuit wires for connecting said electrical components.

4. The combination according to claim 1, wherein the wires forming said plug-in contacts are disposed upon the side of the plate which is free of circuit wires for connecting said electrical components, said circuit wires being disposed upon the other side of the plate, said wires forming said plug-in contacts being respectively drawn through holes formed in said plate for interconnection with the circuit wires disposed on the other side thereof.

5. The combination according to claim 1, wherein the respective wires forming said plug-in contacts are drawn about the plug-in edge of said plate, each such wire forming two legs extending respectively along opposite sides of said edge, said legs being respectively anchored in said plate at the corresponding opposite sides thereof.

6. The combination according to claim 1, wherein said clamping element is a generally circular disk pressfitted in the corresponding hole and having oppositely disposed radially inwardly extending recesses formed therein for holding the respective wire anchored in the corresponding hole.

References Cited in the file of this patent

UNITED STATES PATENTS

| | | |
|---|---|---|
| 1,001,054 | Lawrence | Aug. 22, 1911 |
| 2,858,515 | Thunander et al. | Oct. 28, 1958 |
| 2,993,188 | Anderson | July 18, 1961 |

FOREIGN PATENTS

| | | |
|---|---|---|
| 822,764 | Great Britain | Oct. 28, 1959 |

OTHER REFERENCES

Litton: "Tele-Tech," August 1955, page 149.

Winsker et al.: "Electronic Design," Sept. 15, 1957, page 154.